(12) United States Patent
Asakawa et al.

(10) Patent No.: US 12,306,029 B2
(45) Date of Patent: May 20, 2025

(54) AGGREGATION METHOD AND PROCESSING APPARATUS

(71) Applicant: Tokyo Electron Limited, Tokyo (JP)

(72) Inventors: Takashi Asakawa, Iwate (JP); Satoshi Tanaka, Yamanashi (JP); Ryota Aoi, Hokkaido (JP)

(73) Assignee: Tokyo Electron Limited, Tokyo (JP)

( * ) Notice: Subject to any disclaimer, the term of this patent is extended or adjusted under 35 U.S.C. 154(b) by 349 days.

(21) Appl. No.: 17/692,338

(22) Filed: Mar. 11, 2022

(65) Prior Publication Data

US 2022/0291035 A1    Sep. 15, 2022

(30) Foreign Application Priority Data

Mar. 12, 2021   (JP) .................................. 2021-040448

(51) Int. Cl.
    *G01F 15/06*    (2022.01)
(52) U.S. Cl.
    CPC .................................. *G01F 15/068* (2013.01)
(58) Field of Classification Search
    CPC .... G01F 15/068; G06Q 10/063; G06Q 50/04; H01L 21/67253; H01L 21/67276; H01L 21/67242; G06F 17/18; G05B 19/418
    See application file for complete search history.

(56) References Cited

U.S. PATENT DOCUMENTS

| | | | | |
|---|---|---|---|---|
| 2003/0065471 A1* | 4/2003 | Tsuji | ................. | H01L 21/67276 700/95 |
| 2004/0111226 A1* | 6/2004 | Brewster | ................... | H02J 3/38 702/61 |
| 2012/0323855 A1* | 12/2012 | Koyama | .......... | G05B 19/41875 707/661 |
| 2015/0253762 A1* | 9/2015 | Nakano | ................ | G05B 19/418 700/121 |

FOREIGN PATENT DOCUMENTS

JP    2014-154827 A    8/2014

* cited by examiner

*Primary Examiner* — Mohamed Charioui
*Assistant Examiner* — Dacthang P Ngo
(74) *Attorney, Agent, or Firm* — Venjuris, P.C.

(57) ABSTRACT

An aggregation method includes: acquiring log information including a measurement value of a force used by a processing apparatus and a measurement date and time, the measurement value being measured by a sensor of the processing apparatus that processes a substrate; storing the measurement value of the force and the measurement date and time included in the acquired log information in a storage unit; and integrating the measurement value of the force associated with the measurement date and time in a specified aggregation period with reference to the storage unit to calculate an integrated value of the force for each processing apparatus.

9 Claims, 10 Drawing Sheets

FIG. 6

SELECT AGGREGATION PERIOD

START DATE

20200718

END DATE

| | INTEGRATED VALUES OF FORCE | | | | |
|---|---|---|---|---|---|
| TYPE OF FORCE | JULY 18 TO JULY 24 | JULY 25 TO JULY 31 | AUGUST 1 TO AUGUST 7 | AUGUST 8 TO AUGUST 14 | AUGUST 15 TO AUGUST 22 |
| $SiH_2Cl_2$ FLOW RATE [l] | 8.22 | 9.22 | 6011 | 3.95 | 15.33 |
| $NH_3$ FLOW RATE [l] | 10.99 | 31.32 | 60.11 | 50.31 | 115.99 |
| HF FLOW RATE [l] | 0.33 | 1.23 | 1.42 | 0.12 | 5 |
| $F_2$ FLOW RATE [l] | 4.33 | 9.73 | 15.99 | 8.33 | 9.99 |
| $N_2$ FLOW RATE [l] | 3.91 | 59.39 | 60.33 | 9.33 | 66.34 |
| TOTAL COOLING WATER FLOW RATE [l] | 100.34 | 250.99 | 150.41 | 120.11 | 190.23 |
| HEATER ELECTRIC ENERGY AMOUNT [Kwh] | 139 | 193 | 90 | 201 | 120 |

FIG. 7B

| TYPE OF FORCE | UNIT PRICE (YEN) | TYPE OF WAFER | UNIT PRICE (YEN) |
|---|---|---|---|
| $SiH_2Cl_2$ FLOW RATE [l] | 123 | PRODUCT WAFER | A |
| $NH_3$ FLOW RATE [l] | 90 | MONITOR WAFER | B |
| HF FLOW RATE [l] | 80 | DUMMY WAFER | C |
| $F_2$ FLOW RATE [l] | 100 | ⋮ | ⋮ |
| $N_2$ FLOW RATE [l] | 50 | | |
| TOTAL COOLING WATER FLOW RATE [l] | 30 | | |
| HEATER ELECTRIC ENERGY AMOUNT [Kwh] | 121 | | |

FIG. 7C

| | JULY 18 TO JULY 24 | JULY 25 TO JULY 31 | AUGUST 1 TO AUGUST 7 | AUGUST 8 TO AUGUST 14 | AUGUST 15 TO AUGUST 22 |
|---|---|---|---|---|---|
| COST | 80000 | 79103 | 49353 | 60213 | 50343 |
| NUMBER OF PROCESSED PRODUCT WAFERS | 190 | 211 | 305 | 150 | 123 |
| NUMBER OF PROCESSED MONITOR WAFERS | 10 | 20 | 30 | 10 | 12 |
| NUMBER OF PROCESSED DUMMY WAFERS | 33 | 21 | 13 | 8 | 19 |

AGGREGATION METHOD AND PROCESSING APPARATUS

CROSS-REFERENCE TO RELATED APPLICATION

This application is based on and claims priority from Japanese Patent Application No. 2021-040448 filed on Mar. 12, 2021 with the Japan Patent Office, the disclosure of which is incorporated herein in its entirety by reference.

TECHNICAL FIELD

The present disclosure relates to an aggregation method and a processing apparatus.

BACKGROUND

Japanese Patent Laid-Open Publication No. 2014-154827 discloses, for example, a semiconductor manufacturing apparatus including a storage unit for storing process log data indicating a processing state of a substrate and a display controller for displaying a graph related to the process log data. The display controller for displaying the graph of the semiconductor manufacturing apparatus disclosed in Japanese Patent Laid-Open Publication No. 2014-154827 includes a 2-axis graph display unit for displaying a graph of 2-axis process log data and a 3-axis graph display unit for displaying a graph of 3-axis process log data.

SUMMARY

According to an aspect of the present disclosure, an aggregation method includes: acquiring log information including a measurement value of a force used by a processing apparatus and a measurement date and time, the measurement value being measured by a sensor of the processing apparatus that processes a substrate; storing the measurement value of the force and the measurement date and time included in the acquired log information in a storage unit; and integrating the measurement value of the force associated with the measurement date and time in a specified aggregation period with reference to the storage unit, thereby calculating an integrated value of the force for each processing apparatus.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a view illustrating an example of an input screen for an aggregation period.

FIGS. 7A to 7C are views illustrating an example of an aggregation result by the aggregation method ST2 according to the embodiment.

DETAILED DESCRIPTION

Figure 1:
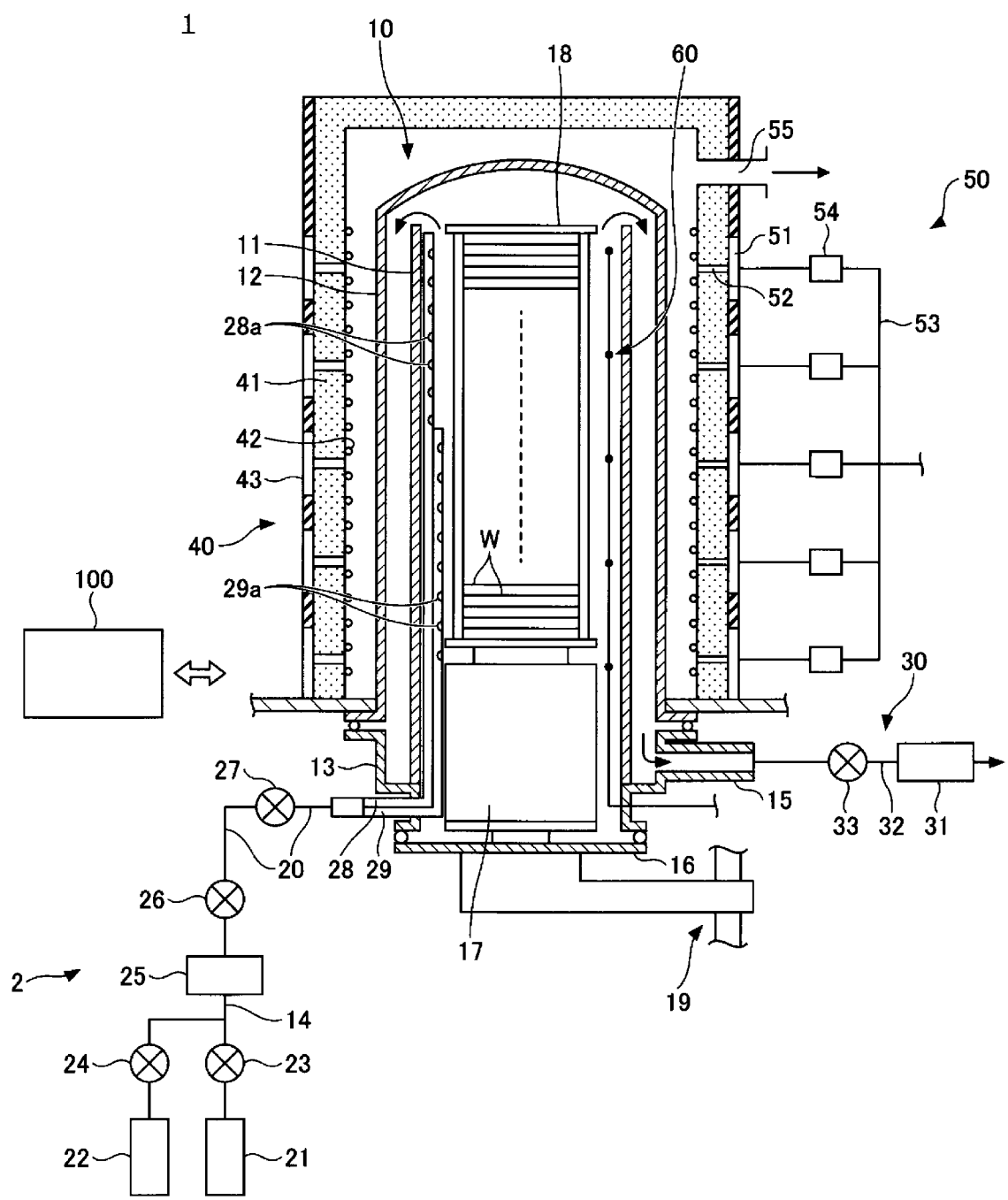
FIG. 1 is a schematic view illustrating an example of a substrate processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the accompanying drawings. In each of the drawings, the same components may be designated by the same reference numerals and duplicate descriptions thereof may be omitted.

<Substrate Processing Apparatus>

First, an example of a substrate processing apparatus according to an embodiment of the present disclosure will be described with reference to FIG. 1. FIG. 1 is a schematic view illustrating an example of a substrate processing apparatus 1 according to the embodiment. The substrate processing apparatus 1 is an example of a processing apparatus capable of visualizing the force used in the own apparatus. The substrate processing apparatus 1 includes a processing container 10, a gas supply 2, an exhauster 30, a heater 40, a cooler 50, a temperature sensor 60, and a controller 100.

The processing container 10 has a substantially cylindrical shape. The processing container 10 includes an inner pipe 11, an outer pipe 12, a manifold 13, injectors 28 and 29, a gas outlet 15, and a cover 16.

The inner pipe 11 has a substantially cylindrical shape. The inner pipe 11 is made of a heat-resistant material such as quartz. The inner pipe 11 is also referred to as an inner tube. The outer pipe 12 has a substantially cylindrical shape with a ceiling, and is provided concentrically around the inner pipe 11. That is, the inner pipe 11 and the outer pipe 12 form a double pipe structure. The outer tube 12 is made of a heat-resistant material such as quartz. The outer tube 12 is also referred to as an outer tube.

The manifold 13 has a substantially cylindrical shape. The manifold 13 supports the lower ends of the inner pipe 11 and the outer pipe 12. The manifold 13 is made of, for example, stainless steel.

The injectors 28 and 29 penetrate the manifold 13 to extend horizontally into the inner pipe 11, bend in an L shape in the inner pipe 11, and extend upward. The base ends of the injectors 28 and 29 are connected to a gas pipe 20. The injectors 28 and 29 have a plurality of gas holes 28a and 29a that opens toward the center of the inner pipe 11. The gas supplied from the injectors 28 and 29 includes, for example, a film forming gas and a processing gas such as a cleaning gas, and an inert gas.

The gas supply 2 includes a gas source 21, a gas supply line 14, a flow rate controller 25, and a gas pipe 20. The gas source 21 is a gas supply source, and may include, for example, a film forming gas source, a cleaning gas source, and an inert gas source.

The gas source 21 is connected to the flow rate controller 25 via the gas supply line 14. An on-off valve 23 is provided on the gas supply line 14. The on-off valve 23 controls the supply of the gas from the gas source 21 and stop of the supply of the gas. The flow rate controller 25 controls the gas supplied from the gas source 21 to a predetermined flow rate and causes the gas to flow to the gas pipe 20. The flow rate controller 25 is, for example, a mass flow controller.

The gas pipe 20 is provided with an on-off valve 27 on the injectors 28 and 29 side, and an on-off valve 26 on the flow rate controller 25 side. By opening and closing the valve bodies of the on-off valves 26 and 27, the supply/stop of supply of various gases and switching of gas are controlled.

The gas output from the gas source 21 is horizontally discharged via the gas pipe 21 from the gas holes 28*a* and 29*a* of the injectors 28 and 29 into the inner pipe 11 which is a reaction region in the processing container 10.

The gas outlet 15 is formed in the manifold 13. An exhaust pipe 32 is connected to the gas outlet 15. The processing gas supplied into the processing container 10 is exhausted by the exhauster 30 via the gas outlet 15.

The exhauster 30 includes an exhaust device 31, an exhaust pipe 32, and a pressure controller 33. The exhaust device 31 is a vacuum pump such as a dry pump or a turbo molecular pump. The exhaust pipe 32 connects the gas outlet 15 and the exhaust device 31. The pressure controller 33 is interposed in the exhaust pipe 32, and controls the pressure in the processing container 10 by adjusting the conductance of the exhaust pipe 32. The pressure controller 33 is, for example, an automatic pressure control valve.

The cover 16 airtightly closes an opening at the lower end of the manifold 13. The cover 16 is made of, for example, stainless steel. A wafer boat 18 is placed on the cover 16 via a heat insulating cylinder 17. The heat insulating cylinder 17 and the wafer boat 18 are made of a heat-resistant material such as quartz. The wafer boat 18 holds a plurality of wafers W substantially horizontally at predetermined intervals in the vertical direction. When a lifting mechanism 19 raises the cover 16, the wafer boat 18 is loaded into the processing container 10 and accommodated therein. When the lifting mechanism 19 lowers the cover 16, the wafer boat 18 is unloaded from the processing container 10.

The heater 40 includes a heat insulating material 41, a heating element 42, and an outer skin 43. The heat insulating material 41 has a substantially cylindrical shape and is provided around the outer pipe 12. The heat insulating material 41 is formed mainly of silica and alumina. The heating element 42 has a linear shape and is provided in a spiral or meandering shape on the inner circumference of the heat insulating material 41. The outer skin 43 is provided to cover the outer periphery of the heat insulating material 41. The outer skin 43 keeps the shape of the heat insulating material 41 and reinforces the heat insulating material 41. The outer skin 43 is made of a metal such as stainless steel. Further, in order to suppress the influence of heat on the outside of the heater 40, a water-cooled jacket (not illustrated) may be provided on the outer periphery of the outer skin 43. The heater 40 heats the inside of the processing container 10 by generating heat from the heating element 42.

The cooler 50 supplies a cooling fluid toward the processing container 10 to cool the wafer W in the processing container 10. The cooling fluid may be, for example, air. The cooler 50 supplies a cooling fluid toward the processing container 10, for example, when the wafer W is rapidly lowered in temperature after heat treatment. Further, the cooler 50 supplies the cooling fluid toward the inside of the processing container 10, for example, at the time of cleaning to remove the deposited film in the processing container 10. The cooler 50 includes a fluid flow path 51, a blowout hole 52, a distribution flow path 53, a flow rate adjustor 54, and a heat exhaust port 55.

A plurality of fluid flow paths 51 is formed in the height direction between the heat insulating material 41 and the outer skin 43. The fluid flow path 51 is, for example, a flow path formed along the circumferential direction on the outside of the heat insulating material 41.

The blowout hole 52 is formed to penetrate the heat insulating material 41 from each fluid flow path 51, and discharges the cooling fluid into the space between the outer pipe 12 and the heat insulating material 41.

The distribution flow path 53 is provided outside the outer skin 43, and distributes and supplies the cooling fluid to each fluid flow path 51. The flow rate adjustor 54 is interposed in the distribution flow path 53, and adjusts the flow rate of the cooling fluid supplied to the fluid flow path 51.

The heat exhaust port 55 is provided above the plurality of blowout holes 52, and discharges the cooling fluid supplied to the space between the outer pipe 12 and the heat insulating material 41 to the outside of the substrate processing apparatus 1. The cooling fluid discharged to the outside of the processing apparatus 1 is cooled by, for example, a heat exchanger and supplied to the distribution flow path 53 again. However, the cooling fluid discharged to the outside of the processing apparatus 1 may be discharged without being reused.

The temperature sensor 60 detects the temperature inside the processing container 10. A plurality of temperature sensors 60 is provided, for example, in the inner pipe 11 at equal intervals in the height direction, and detects temperatures at a plurality of heights in the inner pipe 11.

The substrate processing apparatus 1 includes various sensors. Examples of the sensor provided in the substrate processing apparatus 1 include a temperature sensor 60 and a flow rate controller 25. The flow rate controller 25 monitors and adjusts the flow rate of the gas supplied from the gas source 21.

[Controller]

The controller 100 controls the operation of the substrate processing apparatus 1. The controller 100 may be, for example, a computer. The hardware configuration and functional configuration of the controller 100 will be described below.

(Hardware Configuration)

Figure 2:
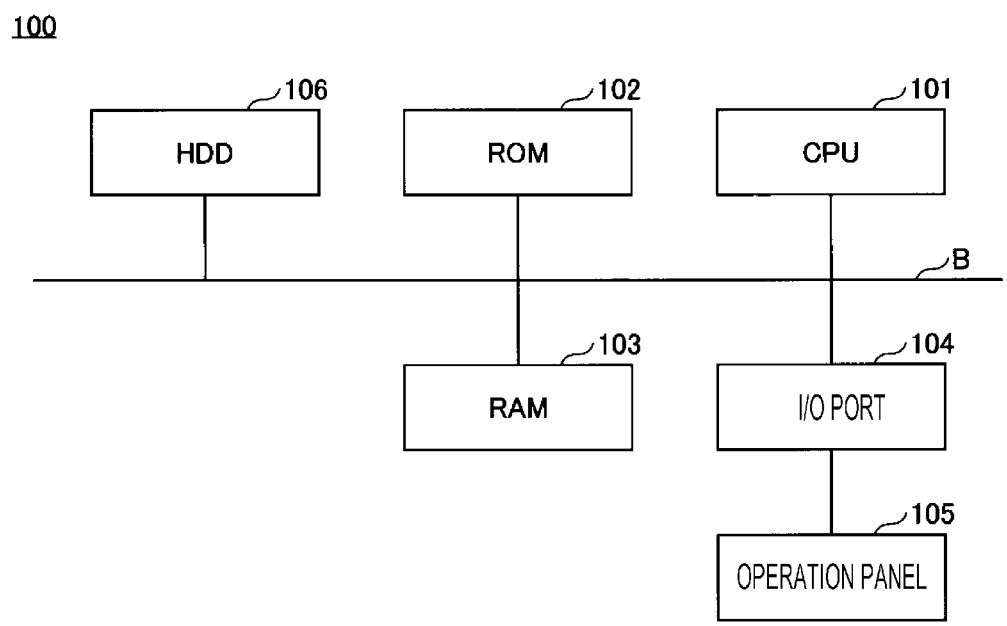
FIG. 2 is a view illustrating an example of a hardware configuration of a controller according to the embodiment.

Next, an example of a hardware configuration of the controller 100 according to the embodiment will be described with reference to FIG. 2. The controller 100 includes a central processing unit (CPU) 101, a read only memory (ROM) 102, a random access memory (RAM) 103, an I/O port 104, an operation panel 105, and a hard disk drive (HDD) 106. Each unit is connected by a bus B.

The CPU 101 controls various operations of the substrate processing apparatus 1, a film forming process, and a cleaning process based on various programs read into RAM 103 and process recipes which are information defining procedures for processes such as the film forming process and the cleaning process. The programs include a program that executes an information collection method and a program that executes an aggregation method. The CPU 101 executes an information collection method and an aggregation method based on the programs read into the RAM 103.

The ROM 102 is a storage medium that is constituted by an electrically erasable programmable read-only memory (EEPROM), a flash memory, or a hard disk, and stores a program or a recipe of the CPU 101. The RAM 103 functions as a work area of the CPU 101.

The I/O port 104 acquires the values of various sensors for detecting a temperature, a pressure, and a gas flow rate from various sensors attached to the substrate processing apparatus 100 and transmits the values to the CPU 101. Further, the I/O port 104 outputs a control signal output by the CPU 101 to each unit of the substrate processing apparatus 1. The operation panel 105 for an operator (user) to operate the substrate processing apparatus 1 is connected to the I/O port 104.

The HDD 106 is an auxiliary storage device and may store recipes and programs. Also, the HDD 106 may store log information of measurement values measured by various sensors.

(Functional Configuration)

Figure 3:
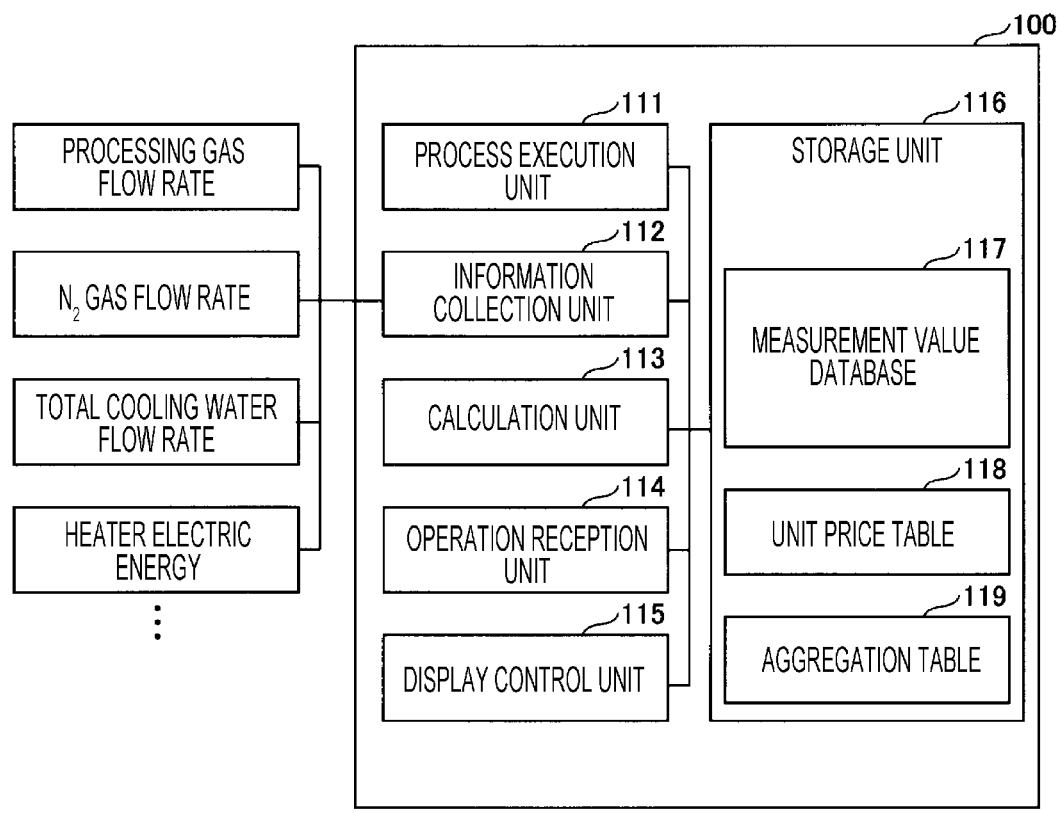
FIG. 3 is a view illustrating an example of a functional configuration of the controller according to the embodiment.

Next, an example of a functional configuration of the controller 100 according to the embodiment will be described with reference to FIG. 3. The controller 100 includes a process execution unit 111, an information collection unit 112, a calculation unit 113, an operation reception unit 114, a display control unit 115, and a storage unit 116.

The process execution unit 111 controls the execution of processes such as the film forming process and the cleaning process executed by the substrate processing apparatus 1. The information collection unit 112 acquires log information including the measurement values measured by various sensors of the substrate processing apparatus 1 and the measurement date and time. The information collection unit 112 acquires the log information collected from the start of execution of the process recipe to the end of execution. For example, in the case of the film forming process, the log information includes a measurement value of the force used until a substrate is loaded into the substrate processing apparatus 1, accommodated in the processing container 10, formed into a film, and unloaded. For example, in the case of the cleaning process, the log information includes the measurement value of the force used until the cleaning is completed in the substrate processing apparatus 1. In the present specification, the term "force" refers to the energy consumed (energy consumption) by the substrate processing apparatus 1, such as a gas (a processing gas, an inert gas, a purge gas, etc.) used in the substrate processing apparatus 1, a heat exchange medium such as cooling water, electric power (heater power, RF power, DC power, exhaust power, etc.), and compressed air.

The information collection unit 112 stores the measurement value of the force included in the acquired log information in a measurement value database 117 of the storage unit 116 in association with the measurement date and time. For example, the information collection unit 112 stores, in the measurement value database 11, the measurement values of the energy consumed by the substrate processing apparatus 1, such as the gas flow rate, the flow rate of the heat exchange medium such as cooling water, various electric energy amounts, and the flow rate of compressed air included in the log information in association with the measurement date and time.

Further, the information collection unit 112 acquires log information including the number of processed wafers used for various processes such as the substrate process executed by the substrate processing apparatus 1 and the processing date and time. The information collection unit 112 stores the number of processed wafers included in the acquired log information in the measurement value database 117 in association with the processing date and time. The processed wafers include various wafers such as a product wafer, a monitor wafer, and a dummy wafer. The product wafer is an example of a substrate for manufacturing a semiconductor device on a wafer. The monitor wafer is a wafer used when adjustments need to be made during the process, and the dummy wafer is a test wafer. The product wafer is more expensive than the monitor wafer and the dummy wafer, and the prices of various wafers are stored in a unit price table 118 of the storage unit 116. Further, the unit price table 118 includes the unit price of various gases, the unit price of cooling water, and the unit price of the heater electric energy amount.

The information collection unit 112 may store the log information in an internal memory (RAM 103) of the controller 100, or may store the log information in an external memory connected to the controller 100 via the network. The external memory may be, for example, a memory provided by a cloud service (memory on the cloud).

The calculation unit 113 refers to the measurement value database 117 of the storage unit 116, integrates the measurement values of the force used at the measurement date and time of the specified aggregation period, and calculates the integrated value of the force of the aggregation period for each substrate processing apparatus 1. Further, the calculation unit 113 may calculate the cost (amount) of the force used in the aggregation period from the integrated value of the force in the aggregation period and the unit price of each force with reference to the unit price table 118 of the storage unit 116. Also, the calculation unit 113 may calculate the integrated value of the number of processed wafers used at the processing date and time of the aggregation period with reference to the measurement value database 117. The calculation unit 113 may calculate the cost per processed product wafer during the aggregation period (hereinafter, also referred to as a cost per wafer) based on the cost of the force used in the aggregation period and the integrated value of the number of processed product wafers. The aggregation result obtained by the calculation unit 113 is stored in an aggregation table 119 of the storage unit 116.

The operation reception unit 114 receives user operations. The operation reception unit 114 determines the aggregation period selected by the operation performed by the user to request the display of the aggregation result as the specified aggregation period. However, the operation reception unit 114 may determine the aggregation period automatically specified.

The display control unit 115 displays the integrated value of the force used in the specified aggregation period, which is the aggregation result. The display control unit 115 may divide the specified aggregation period into several small periods and display the integrated value of the force used for each small period. The display control unit 115 may display the cost per wafer for the specified aggregation period. This information may be displayed as a graph or table. Thus, the energy consumption and the cost for each substrate processing apparatus 1 in the specified aggregation period may be visualized and provided to the user.

The functions of the process execution unit 111, the calculation unit 113, and the display control unit 115 are implemented by the CPU 501 executing the program expanded from the HDD 106 to the RAM 103. The functions of the information collection unit 112 and the operation reception unit 114 are implemented by the I/O port 104 and the operation panel 105. The storage unit 116 is implemented by a ROM 102, a RAM 103, an HDD 106, or an external storage device.

[Information Collection Method]

Figure 4:
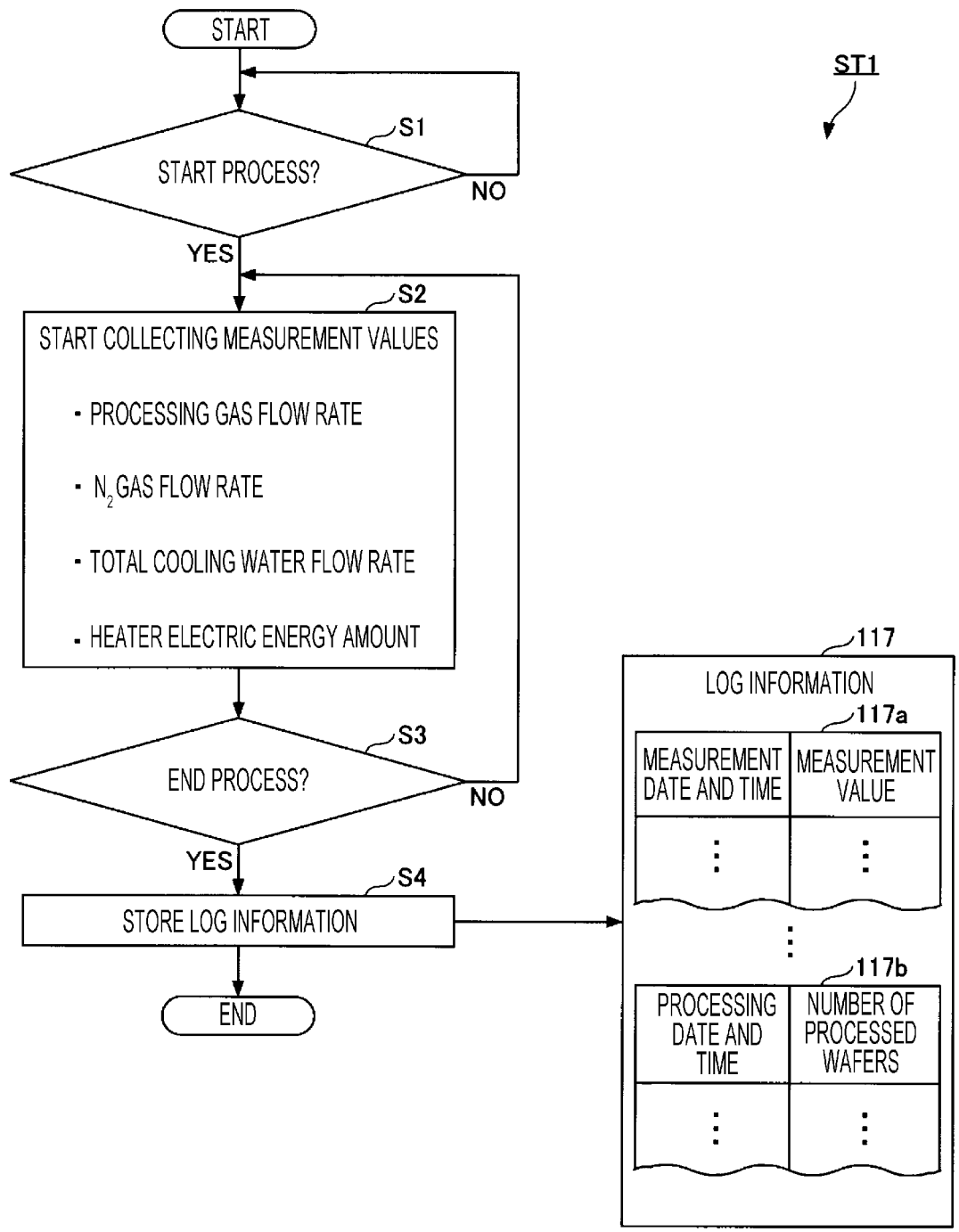
FIG. 4 is a flow chart illustrating an example of an information collection method ST1 according to the embodiment.

Next, an example of an information collection method ST1 according to the embodiment will be described with reference to a flow chart illustrating an example of the information collection method ST1 of FIG. 4. This process is mainly executed by the information collection unit 112 of the controller 100.

When this process is started, the information collection unit 112 determines whether the process execution unit 111 has started the process (step S1). When the process execution unit 111 instructs the process to start according to the process recipe, the wafer boat 18 is loaded into the processing container 10 and accommodated in the processing container 10 by the lifting mechanism 19 raising the cover 16. In addition, various gases, cooling water, and heater electric power are supplied into the processing container 10.

The information collection unit 112 starts collecting the log information of measurement values by various sensors of the substrate processing apparatus 1 from the start of the process (step S2). Examples of the measurement values to be collected include a processing gas flow rate, a $N_2$ gas flow rate, a total cooling water flow rate, and a heater electric energy amount. The $N_2$ gas flow rate includes the purge gas used in the processing container 10 of the substrate processing apparatus 1 and the purge gas used in the load lock chamber (not illustrated). The measurement date and time are collected along with the measurement values. The measurement date and time may be the date and time when the measurement values are measured by the various sensors, or may be the date and time when the information collection unit 112 acquires the measurement values measured by the various sensors. Further, the measurement date and time may be information on the date and time, or may include time information in addition to the date and time.

The information collection unit 112 may collect the number of processed wafers used in the substrate processing apparatus 1. That is, the collected log information may include the number of processed wafers. The number of processed wafers includes the number of product wafers, the number of monitor wafers, and the number of dummy wafers. The processing date and time are collected along with the number of processed wafers. The processing date and time may be the date and time when the wafers are processed, or may be the date and time when the information collection unit 112 acquires the number of processed wafers. Further, the processing date and time may be information on the date and time, or may include time information in addition to the date and time.

The information collection unit 112 determines whether the process execution unit 111 has ended the process (step S3). The information collection unit 112 repeats the processes of steps S2 and S3 until it is determined that the process is completed, and continues to collect the measurement values. When the process execution unit 111 instructs the process to start according to the process recipe, the wafer boat 18 is unloaded out of the processing container 10 by the lifting mechanism 19 lowering the cover 16. In addition, the supply of various gases, cooling water, and heater electric power into the processing container 10 is stopped.

The information collection unit 112 ends the collection of measurement values by various sensors according to the end determination of the process, stores the collected log information in the measurement value database 117 of the storage unit 116 (step S4), and ends this process. The process of step S4 may be performed between steps S2 and S3.

As a result, log information 117a in which the measurement values measured by various sensors and the measurement date and time are associated with is stored in the measurement value database 117. Further, log information 117b in which the number of processed wafers and the processing date and time are associated with each other is stored in the measurement value database 117.

[Aggregation Method]

Figure 5:
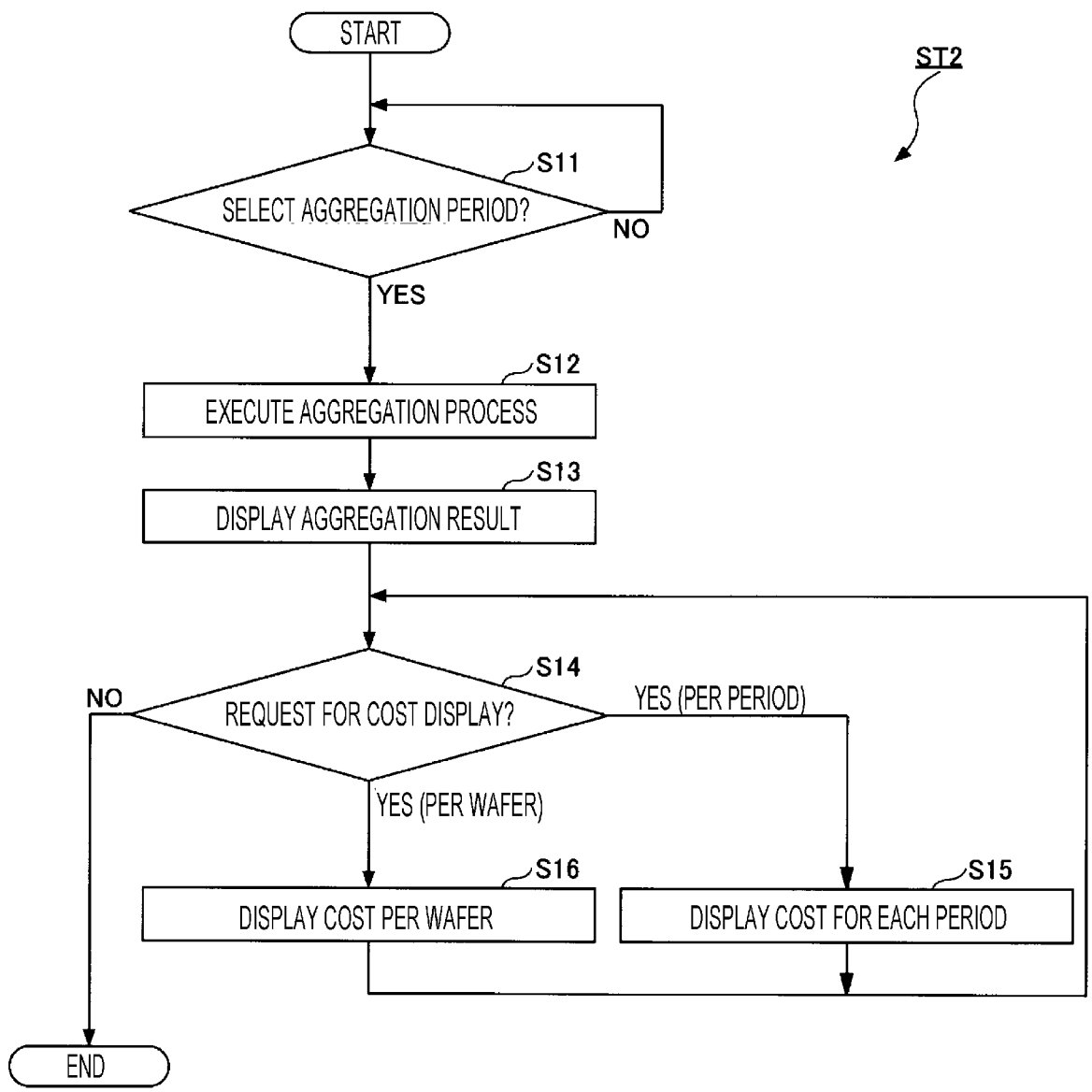
FIG. 5 is a flow chart illustrating an example of an aggregation method ST2 according to the embodiment.

Next, an example of an aggregation method ST2 according to the embodiment will be described with reference to a flow chart illustrating an example of the aggregation method ST2 according to the embodiment of FIG. 5. This process is mainly executed by the calculation unit 113, the operation reception unit 114, and the display control unit 115 of the controller 100.

When this process is started, the operation reception unit 114 determines whether the aggregation period has been selected (step S11). FIG. 6 illustrates an example of an input screen for the aggregation period. When the start date and the end date of the aggregation period are selected according to the screen operation of the user, the operation reception unit 114 determines that the aggregation period has been selected and specifies the aggregation period, and the calculation unit 113 executes the aggregation process in the specified aggregation period (step S12). In FIG. 5, the aggregation process is not started until the user's screen operation is performed in steps S1 and S2. However, the present disclosure is not limited thereto, and the calculation unit 113 may automatically specify the aggregation period and start the aggregation process.

In the aggregation process, the calculation unit 113 refers to the log information in the measurement value database 117 stored in the storage unit 116, and calculates the integrated value of the measurement value of the force associated with the measurement date and time of the specified aggregation period. For example, as illustrated in FIG. 6, when the specified aggregation period is from Jul. 18, 2020 to Aug. 22, 2020, the calculation unit 113 extracts the measurement value associated with the measurement date and time of the aggregation period from the measurement value database 117, and integrates the extracted measurement value of the force.

FIG. 7A illustrates an example of the aggregation table 119 in which the aggregation result by the aggregation method ST2 of the present disclosure is stored. In FIG. 7A, $SiH_2Cl_2$ gas, $NH_3$ gas, HF gas, $F_2$ gas, $N_2$ gas, a total cooling water flow rate, and a heater electric energy amount are illustrated as examples of the types of force, and the integrated value of the force for each week is stored as the aggregation result of each force. However, the type of force is an example and is not limited thereto. Further, calculating the integrated value of the force is not limited to calculating the integrated value of the force in each small period by dividing the specified aggregation period into small periods, and the integrated value of the force in the aggregation period may be calculated.

Figure 8A:
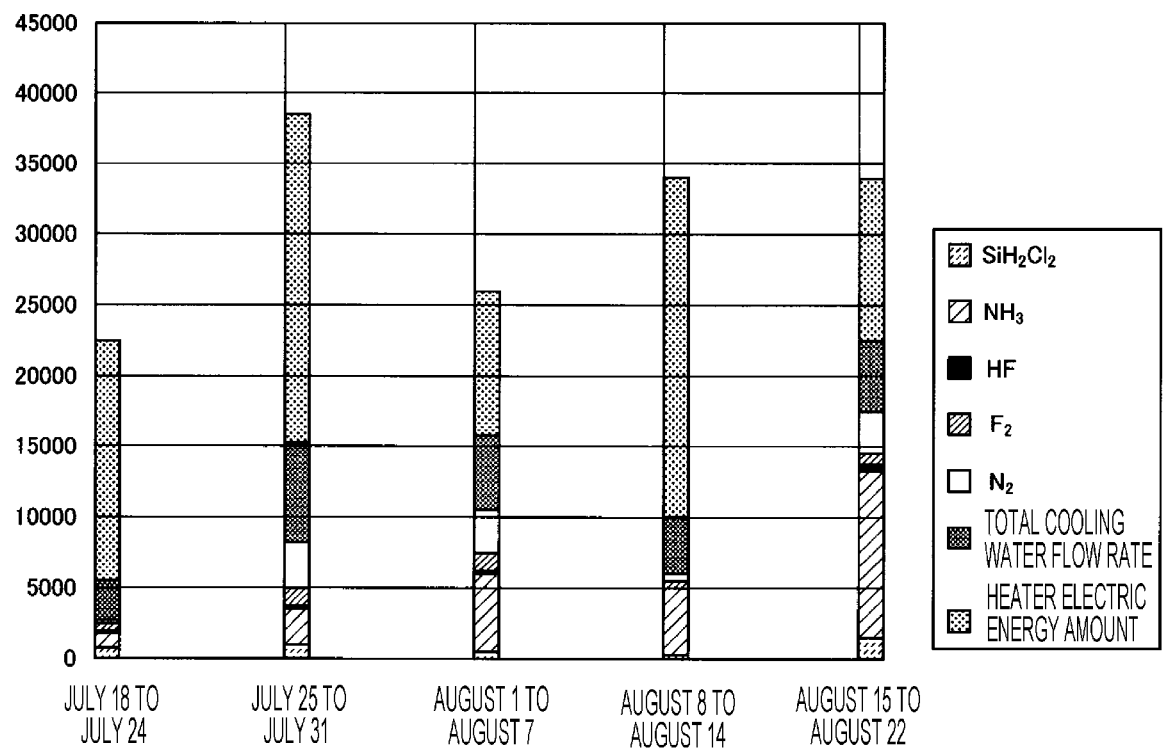
FIGS. 8A and 8B are views illustrating a display example of the aggregation result by the aggregation method ST2 according to the embodiment.
Figure 8B:
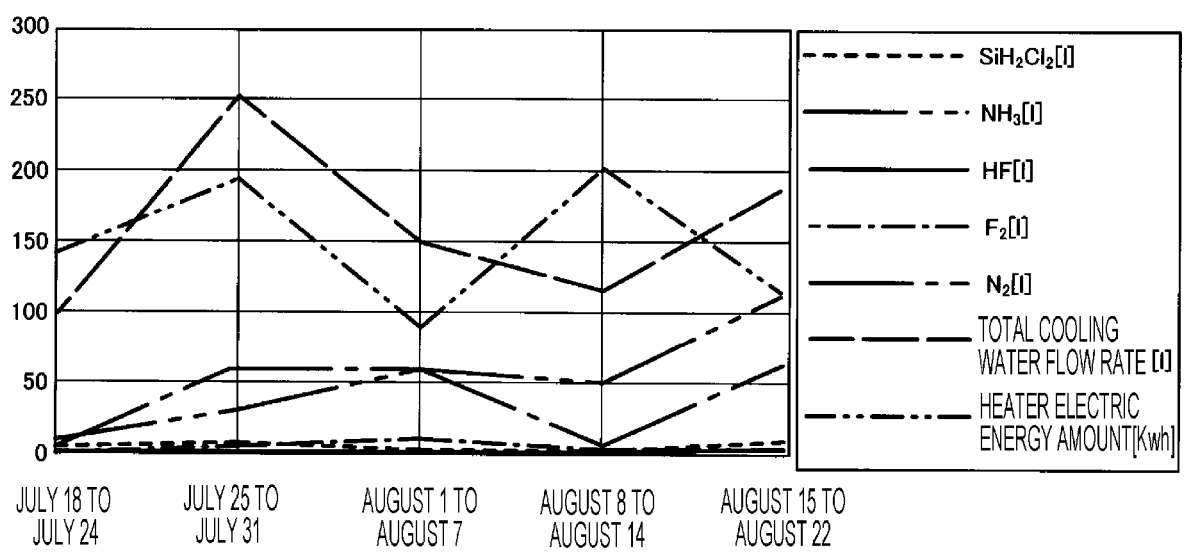

The display control unit 115 displays the aggregation result (step S13). The display control unit 115 may automatically display the aggregation result, or may display the result on the user terminal in response to the user's display request. FIGS. 8A to 8C illustrate a display example of the aggregation result obtained by the aggregation method ST2 according to the embodiment. FIG. 8A illustrates a bar graph indicating the weekly aggregation results stored in the aggregation table 119 of FIG. 7A. Accordingly, the integrated value of the force used by the substrate processing apparatus 1 is displayed on the screen every week from Jul. 18, 2020 to Aug. 22, 2020, which is the aggregation period. As a result, it is possible to visualize the energy consumption of the substrate processing apparatus 1, and it is possible to provide the user with an environment in which the transition of the energy consumption every week is easily grasped. In addition, since the energy consumption for each type of force is displayed on a weekly basis, the user may easily grasp the transition of the amount of each force used.

FIG. 8B illustrates the aggregation result of FIG. 7A as a line graph for each week. The unit and range (the difference between the maximum value and the minimum value of the integrated value of each force) are different for the weekly integrated value of each force of various gases, cooling water, and heaters. Therefore, when the user selects the type of force that he/she wants to see in detail from the display screen, the display control unit 115 may display the vertical axis of the scale suitable for displaying the selected force type, and hide the scale of the vertical axis of the non-selected force type.

Figure 9A:
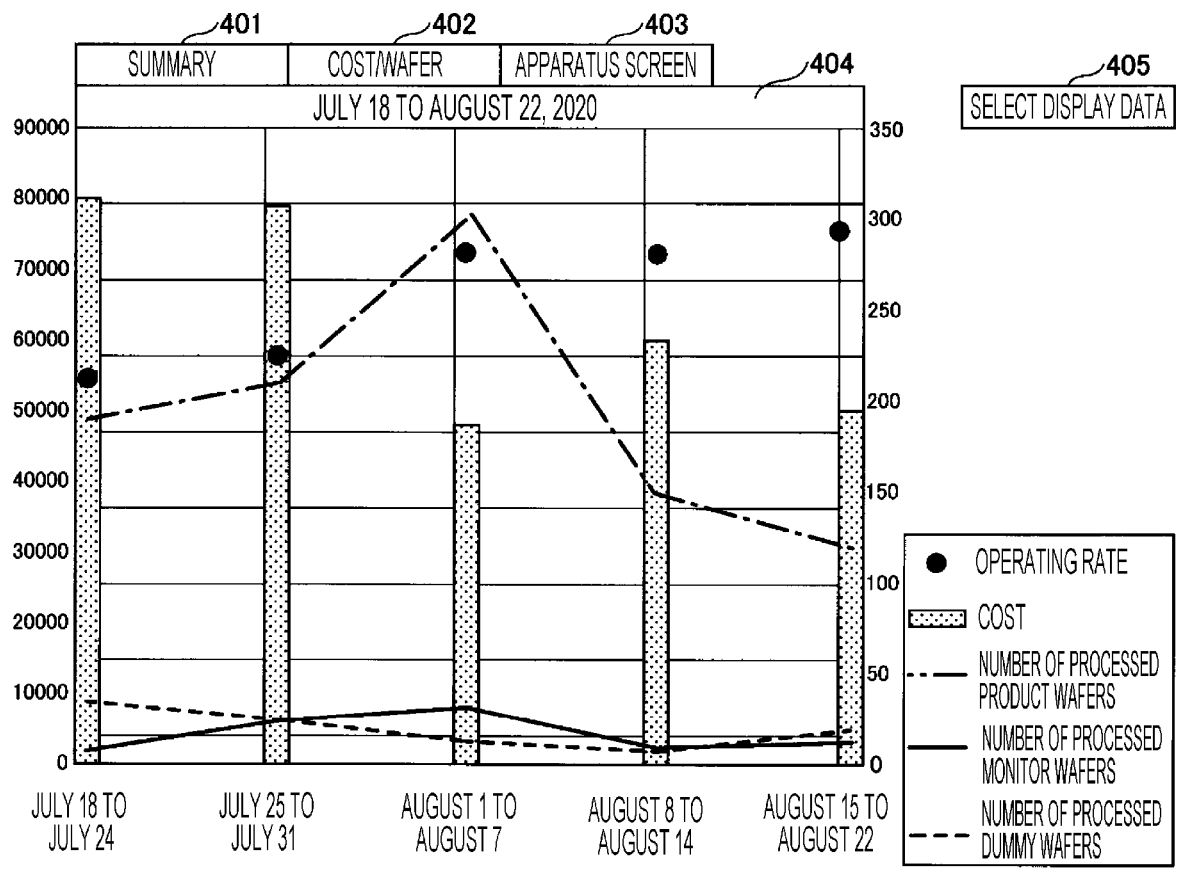
FIGS. 9A and 9B are views illustrating a display example of the aggregation result by the aggregation method ST2 according to the embodiment.

Next, the calculation unit 113 determines whether there is a request for cost display (step S14). The calculation unit 113 may determine that the request for cost display has been made by the user pressing a cost display icon or button on the screen. When it is determined that no request for cost display has been made, the calculation unit 113 ends this process. When it is determined that the request for cost display has been made, the calculation unit 113 proceeds to step S15 when the user requests the cost display for each period, and proceeds to step S16 when the cost display per wafer is requested. In the following, two types of cost display will be performed separately for steps S15 and S16, but the present disclosure is not limited thereto. When a request for cost display is made, both the cost for each period and the cost per wafer may be automatically displayed on the screen. In the present disclosure, for example, when the tab 401 of the "Summary" of FIG. 9A is selected by the user, the process may proceed to step S15 to calculate the cost for the specified aggregation period (the period 404 of FIG. 9A) and display the cost display screen of FIG. 9A. Further, when the tab 402 of the "Cost/Wafer" of FIG. 9A is selected by the user, the process may proceed to step S16 to calculate the cost per wafer in the aggregation period and display the screen for displaying the cost per product wafer in FIG. 9B. When the tab 403 of the "Apparatus Screen" of FIG. 9A is selected, the configuration diagram of the substrate processing apparatus 1 to be aggregated is displayed. Further, when the display data selection button 405 is selected, the data of the force selected by the user may be displayed.

The calculation unit 113 calculates the cost for each period in response to the request for displaying the cost for each period. FIG. 7B is an example of the unit price table 118. The calculation unit 113 multiplies each unit price of the force of the unit price table 118 by the aggregation result of the weekly force illustrated in FIG. 7A to calculate the total cost of each force for each week. In the examples of FIGS. 7A and 7B, the calculation unit 113 multiplies the aggregation result of each force of $SiH_2Cl_2$ gas, $NH_3$ gas, HF gas, $F_2$ gas, $N_2$ gas, a total cooling water flow rate, and a heater electric energy amount of each week by the unit price of $SiH_2Cl_2$ gas to calculate the integrated value of the cost for each week. As a result, the amount of force used may be converted into a cost and visualized from the amount of force used and the unit price of each force. FIG. 7C illustrates an example of an aggregation table 119 in which the aggregation period is divided into five weeks and the result of converting the amount of force used for each week into a cost (amount) is stored. That is, in addition to the information illustrated in FIG. 7A, the information illustrated in FIG. 7C may be stored in the aggregation table 119. In the example of FIG. 7C, the aggregation table 119 stores the weekly cost and the integrated value of the weekly number of processed wafers (product wafers, monitor wafers, and dummy wafers).

In FIG. 9A, the cost of each force is calculated by utilizing the amount of each force used in FIG. 7A and the unit price of each force in FIG. 7B, the aggregation period is divided into weeks, the integrated value of the total force cost of the substrate processing apparatus 1 is aggregated for each week, and the obtained integrated value of the total force cost is illustrated in a bar graph for each week. In addition, the number of processed wafers (product wafers, monitor wafers, and dummy wafers) for each week is displayed as a line graph. The vertical axis (in the left side) of FIG. 9A indicates the cost, and the vertical axis (on the right side) indicates the number of processed wafers.

In FIG. 9A, the weekly cost of the aggregation table 119 illustrated in FIG. 7C and the integrated value of the number of processed wafers are displayed as a graph. Further, FIG. 9A illustrates the weekly operating rate of the substrate processing apparatus 1 to be aggregated. The operating rate may be calculated from, for example, the ratio of the operating time and the idle time during the aggregation period, or by another method. The aggregation result may be displayed in the tabular format illustrated in FIGS. 7A and 7C instead of the graph of FIG. 9A. Accordingly, the aggregation period from Jul. 18, 2020 to Aug. 22, 2020 is divided into weeks, and the weekly cost aggregated for each substrate processing apparatus 1 is displayed on the screen. Thus, the result of converting the energy consumption of each week used by the substrate processing apparatus 1 into a cost, that is, the amount of money used may be visualized, and the transition of the cost for each week may be easily grasped.

This makes it possible to provide an environment in which the amount of force used (energy consumption) for each period indicated in the graph of FIG. 8A and the amount (cost) of force used for each period indicated in the graph of FIG. 9A are visualized and compared with each other. That is, by visualizing the amount of energy consumed by the substrate processing apparatus 1 and the running cost separately for each period, the user may weigh whether to prioritize the cost or the operating rate of the substrate processing apparatus 1 and may be provided with an environment in which the optical device operation is selectable.

Until now, the measurement values of the sensors attached to the substrate processing apparatus 1 have been stored in a storage unit as log information. However, the collected log information does not present the information that allows the user to grasp how much force is used by each substrate processing apparatus 1 and how much cost is incurred.

According to the aggregation method ST2 of the present disclosure, for the specified aggregation period, the amount of the force used for a predetermined period (e.g., weekly, monthly, yearly, etc.) is automatically aggregated, converted into cost, and then displayed as a graph or a table. As a result, the user may easily grasp the transition of the usage amount and the transition of the cost of the entire force based on the display content of the aggregation result. In addition, it becomes possible to display a load factor for each item when the integrated value for each period of the amount of force used is converted into cost. For example, FIG. 8A indicates a breakdown of the amount of force used. Therefore, the user may easily grasp not only the weekly transition of the entire force but also the weekly transition of each force.

When it is determined in step S14 that the cost display per wafer is required, the calculation unit 113 calculates the cost per wafer. The calculation unit 113 calculates the integrated value of the weekly cost by multiplying the integrated value of each weekly force illustrated in FIG. 7A by each unit price. The calculation unit 113 divides the calculated integrated value of the cost by the weekly integrated number of product wafers stored in the aggregation table 119 of FIG. 7C. This makes it possible to calculate the cost per wafer for each week.

Figure 9B:
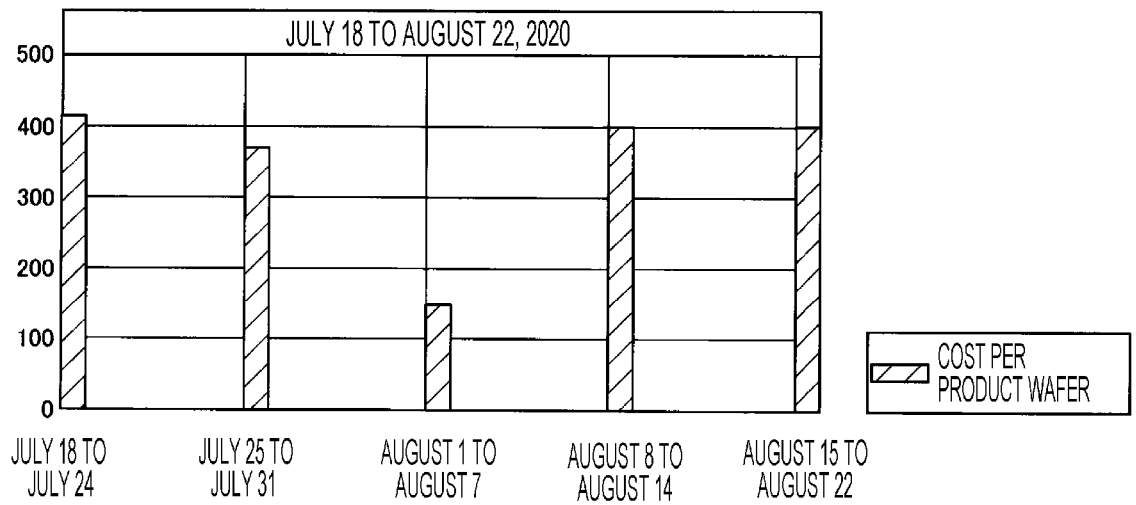

FIG. 9B illustrates the calculated cost per wafer as a line graph for each week. Accordingly, the cost per product wafer is displayed on the screen every week from Jul. 18, 2020 to Aug. 22, 2020, which is the aggregation period. As a result, the cost per product wafer used by the substrate processing apparatus 1 for each week may be visualized, and the transition of the cost per product wafer may be easily grasped. However, the cost per product wafer is not limited to the cost per product wafer, and the cost per wafer may be calculated and displayed. After executing the processes of steps S15 and S16, the process returns to step S14, and when it is determined in step S14 that there is no display request, this process ends.

In the embodiment, the aggregation period is divided into weeks for aggregation, but the aggregation unit for the specified aggregation period may be, for example, weekly, monthly, or yearly. Further, the aggregation unit may be selected by the user or may be set automatically.

According to the aggregation method ST2 described above, it is possible to display the integrated amount of the force used in the aggregation period for each of the substrate processing apparatuses 1 and the transition of the usage amount. Further, it is possible to convert the integrated amount of the usage amount of the force into cost and display the cost and the transition of the cost in the aggregation period for each of the substrate processing apparatuses 1. In addition, by displaying the breakdown of the usage amount of the force, it is possible to easily grasp not only the transition of the usage amount of the entire force but also the transition of the usage amount of each force. Not only the cost of the entire force but also the cost of each force may be displayed.

[Substrate Processing System]

Figure 10:
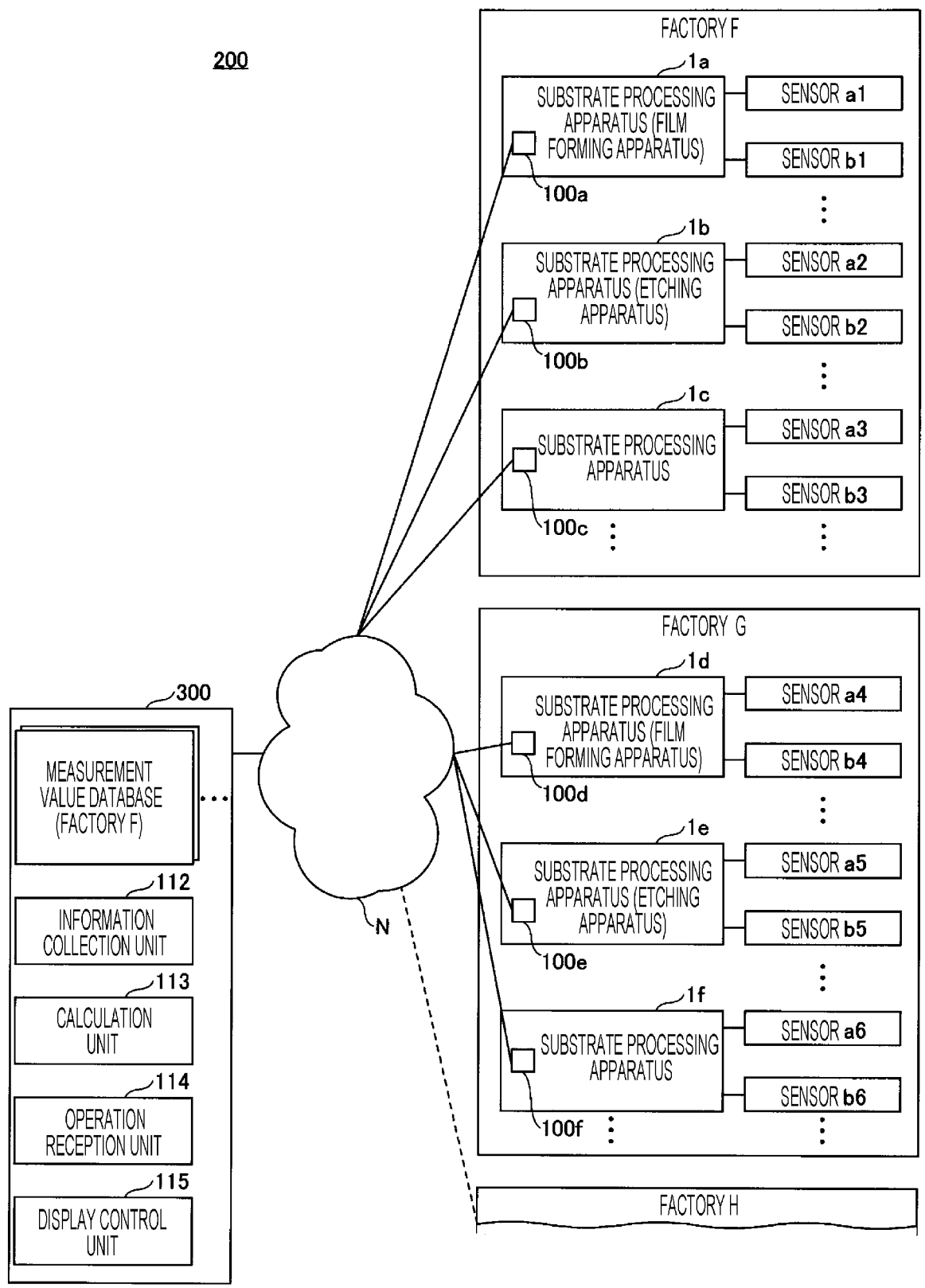
FIG. 10 is a schematic view illustrating an example of a substrate processing system according to the embodiment.

The information collection method ST1 and the aggregation method ST2 of the present disclosure have been described with reference to an example executed by a controller 100 provided corresponding to each substrate processing apparatus 1. However, the present disclosure is not limited thereto. As illustrated in FIG. 10, the controller 300 may execute a substrate processing system 200 in which the plurality of substrate processing apparatuses 1 and the controller 300 are connected via the network N.

That is, in the description so far, in controllers 100a to 100f, etc. corresponding to the substrate processing apparatuses 1a to 1f, etc., respectively, provided in each factory F, G, H, etc., the information collection method ST1 and the aggregation method ST2 of the log information of each of the substrate processing apparatuses 1a to if are executed.

However, the controllers 100a to 100f, etc. may execute the information collection method ST1 and collect the log information of the respective substrate processing apparatuses 1a to 1f, etc., and the controller 300 may execute the aggregation method ST2. In this case, the collected log information is sent from the controllers 100a to 100f, etc. to the controller 300. The controller 300 may calculate and display the amount of force used (energy consumption) and the cost for each of the substrate processing apparatuses 1a to 1f, etc.

Accordingly, it is possible to compare the energy consumption and the cost of each of the substrate processing apparatuses 1a to 1f, etc. As a result, it is possible to grasp the operating status of various substrate processing apparatuses 1 in a situation where apparatuses for executing various processes (e.g., the substrate processing apparatus 1a executes a film forming step, and the substrate processing apparatus 1b executes an etching step) are provided in the factory.

This makes it possible to uniformly compare the states of various types of substrate processing apparatuses 1 in terms of energy consumption and cost. Further, it is possible to compare the differences between the machines of the same type of substrate processing apparatus 1 in terms of energy consumption and cost. Also, the controller 300 aggregates the energy consumption and the cost for each factory, so that the energy consumption and the cost may be aggregated and visualized in consideration of the actual operation.

At present, while a global demand for environmental load reduction is required, an index for operating the substrate processing apparatus 1 may be indicated in consideration of the environment by displaying the energy consumption of resources such as a gas for each substrate processing apparatus 1 and the cost per wafer or lot for each substrate processing apparatus 1. For example, with reference to the cost display, the user may compare the case where 100% of the electric power of the heater is used and the case where the energy saving operation is performed with a smaller amount of electric power. As a result, the user may know how much the cost has been reduced by the operation method and how much the environmental load has been reduced, so that the device may be operated for implementing the use of energy in consideration of the environment.

Further, the controller 300 may aggregate the energy consumption and cost of each factory based on the log information of each factory. For example, $N_2$ gas is comprehensively supplied by a plurality of substrate processing apparatuses 1 in the same factory. Therefore, the controller 300 may aggregate and visualize the energy consumption and the cost in consideration of the actual operation by aggregating the energy consumption and the cost for each factory.

The substrate processing apparatus of the present disclosure may be any device that performs a predetermined process (e.g., a film forming process, an etching process, a cleaning process, etc.), and is not limited to the substrate processing apparatus 1 illustrated in FIG. 1. Further, the substrate processing apparatus of the present disclosure may be an apparatus using plasma.

According to an aspect of the present disclosure, the energy consumption used for each processing apparatus is visualized.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An aggregation method comprising:

acquiring, by a computer, log information including a measurement value of a force used by each of a plurality of processing apparatuses, a measurement date and time, a number of substrates processed by each of the plurality of processing apparatuses, and a processing date and time, the measurement value being measured by a sensor of each of the plurality of processing apparatuses that processes a substrate;

storing, by the computer, the measurement value of the force, the measurement date and time, the number of processed substrates, and the processing date and time included in the log information acquired in the acquiring, in a memory;

integrating, by the computer, the measurement value of the force associated with the measurement date and time, and the number of processed substrates associated with the processing date and time in a specified aggregation period with reference to the memory, thereby calculating an integrated value of the force for each of the plurality of processing apparatuses and an integrated value of a force per processed substrate based on the integrated value of the force and the integrated value of the number of processed substrates; and controlling, by the computer, the plurality of processing apparatuses based on the integrated value of the force for each of the plurality of processing apparatuses and the integrated value of the force per processed substrate.

2. The aggregation method according to claim 1, further comprising: displaying the integrated value of the force for each specified aggregation period as a graph or a table on a display.

3. The aggregation method according to claim 2, further comprising displaying the integrated value of the force per processed substrate in association with the specified aggregation period.

4. The aggregation method according to claim 2, further comprising:

dividing the specified aggregation period into small periods; and displaying the integrated value of the force used for each of the small periods.

5. The aggregation method according to claim 1, further comprising:

receiving a user operation and determining an aggregation period selected according to the user operation as the specified aggregation period.

6. The aggregation method according to claim 1, wherein the measurement value of the force includes at least one of a flow rate of each of various gases, a flow rate of a heat exchange medium, and an electric energy amount used by each of the plurality of processing apparatuses, or a combination thereof.

7. The aggregation method according to claim 1, wherein the memory stores a unit price of each force, the aggregation method further comprising:

calculating at least one of a cost for the integrated value of the force and a cost for the integrated value of the force per processed substrate, from the unit price of each force with reference to the memory; and controlling the plurality of processing apparatuses based on at least one of the calculated cost for the integrated value of the force and the calculated cost for the integrated value of the force per processed substrate in association with the specified aggregation period.

8. The aggregation method according to claim 1, wherein the acquiring acquires the log information collected from a start of execution of a process recipe to an end of execution.

9. A processing system comprising:

a plurality of processing apparatuses each including a sensor;

a memory; and a controller coupled to the memory and configured to execute a process including:

acquiring log information including a measurement value of a force used by each of the plurality of processing apparatuses, a measurement date and time, a number of substrates processed by each of the plurality of processing apparatuses, and a processing date and time, the measurement value being measured by the sensor;

storing the measurement value of the force, the measurement date and time, the number of processed substrates, and the processing date and time included in the log information acquired in the acquiring, in the memory;

integrating the measurement value of the force associated with the measurement date and time, and the number of processed substrates associated with the processing date and time in a specified aggregation period with reference to the memory, thereby calculating an integrated value of the force for each of the plurality of processing apparatuses and an integrated value of a force per processed substrate based on the integrated value of the force and the integrated value of the number of processed substrates; and controlling the plurality of processing apparatuses based on the integrated value of the force for each of the plurality of processing apparatuses and the integrated value of the force per processed substrate.

* * * * *